(12) United States Patent
Wu et al.

(10) Patent No.: US 11,095,294 B2
(45) Date of Patent: Aug. 17, 2021

(54) PHASE-LOCKED LOOP AND METHOD FOR CALIBRATING VOLTAGE-CONTROLLED OSCILLATOR THEREIN

(71) Applicant: GOWIN Semiconductor Corporation, Guangzhou (CN)

(72) Inventors: Qiming Wu, Guangzhou (CN); Xiaozhi Lin, Guangzhou (CN); Qiang Zhou, Guangzhou (CN); Yunfeng Wang, Guangzhou (CN)

(73) Assignee: GOWIN Semiconductor Corporation, Guangzhou (CN)

( * ) Notice: Subject to any disclaimer, the term of this patent is extended or adjusted under 35 U.S.C. 154(b) by 0 days.

(21) Appl. No.: 16/909,976

(22) Filed: Jun. 23, 2020

(65) Prior Publication Data

US 2020/0403623 A1 Dec. 24, 2020

(30) Foreign Application Priority Data

Jun. 24, 2019 (CN) .......................... 201910546728.7

(51) Int. Cl.
*H03L 7/089* (2006.01)
*H03L 7/093* (2006.01)
(Continued)

(52) U.S. Cl.
CPC ............ *H03L 7/0895* (2013.01); *H03L 7/093* (2013.01); *H03L 7/099* (2013.01); *H03L 7/18* (2013.01); *H03L 2207/06* (2013.01)

(58) Field of Classification Search
CPC ..... H03L 7/099; H03L 2207/06; H03L 7/087; H03L 7/0992; H03L 7/18
See application file for complete search history.

(56) References Cited

U.S. PATENT DOCUMENTS

| | | | |
|---|---|---|---|
| 9,401,724 B1* | 7/2016 | Gao | .......................... H03L 3/00 |
| 10,715,158 B1* | 7/2020 | Joshi | ....................... H03L 7/187 |
| 2013/0257547 A1* | 10/2013 | Arai | ....................... H03L 7/099 |
| | | | 331/18 |

FOREIGN PATENT DOCUMENTS

| | | |
|---|---|---|
| CN | 101257302 A | 9/2008 |
| CN | 101860360 A | 10/2010 |

(Continued)

OTHER PUBLICATIONS

U.S. Appl. No. 13/910,371, filed Feb. 17, 2015, Virginia Tech Intellectual Properties, Inc.

*Primary Examiner* — Patrick C Chen
(74) *Attorney, Agent, or Firm* — True Shepherd LLC; Andrew C. Cheng

(57) ABSTRACT

A phase-locked loop (PLL) and a method for calibrating a VCO therein are provided. The PLL comprises a frequency-phase detector, a charge pump, a loop filter, a VCO, a divider and a calibration circuit. The calibration circuit is used to acquire a frequency of an output signal of the VCO, to calibrate the frequency of the output signal according to an expected frequency, and to acquire frequency control parameters of the VCO at the current signal frequency. The amplitude and gain of the output signal are kept constant according to the amplitude control parameters and gain control parameters. The PLL can meet the demands on frequencies of multiple protocols and can adaptively look up and stabilize the suitable frequency. It solves the issue that the amplitude of the output signal of the VCO is not constant when the PLL operates in a large frequency range.

3 Claims, 10 Drawing Sheets

(51) Int. Cl.
*H03L 7/18* (2006.01)
*H03L 7/099* (2006.01)

(56) References Cited

FOREIGN PATENT DOCUMENTS

| | | |
|---|---|---|
| CN | 105577180 A | 5/2016 |
| CN | 205754277 U | 11/2016 |
| CN | 106209087 A | 12/2016 |
| CN | 107968687 A | 4/2018 |
| EP | 3267578 A1 | 1/2018 |

* cited by examiner

PHASE-LOCKED LOOP AND METHOD FOR CALIBRATING VOLTAGE-CONTROLLED OSCILLATOR THEREIN

CROSS-REFERENCE TO RELATED APPLICATIONS

This application claims priority to Chinese Patent Application No. 201910546728.7 with a filing date of Jun. 24, 2019. The content of the aforementioned application, including any intervening amendments thereto, is incorporated herein by reference.

TECHNICAL FIELD

The exemplary embodiment of present invention relates to the field of phase-locked loop circuit technology, and in particular, to a phase-locked loop and a method for calibrating a voltage-controlled oscillator (VCO) therein.

BACKGROUND OF THE PRESENT INVENTION

The phase-locked loop is an indispensable part of the high-speed communication system. The phase-locked loop provides a suitable clock frequency for the high-speed communication system as a frequency synthesizer. The phase-locked loop of VCO based on LC tank has excellent phase noise characteristics. It is widely used in the high-speed communication system. The LC tank in VCO has high quality, so its operating frequency range is narrow. Furthermore, when the phase-locked loop operates, the oscillating voltage signal of the LC tank will increase with the frequency increase. And the voltage signal will increase, which will lead to the voltage limit of the relevant module and seriously affect operating stability and noise characteristics of the VCO. Another disadvantage of the VCO based on LC tank is that with the increase of frequency, the VCO gain will increase, and the change of VCO gain will lead to the change of loop characteristics, which will affect the performance of the phase-locked loop.

SUMMARY OF PRESENT INVENTION

An object of the exemplary embodiment of the present invention is to provide a method for calibrating a phase-locked loop and a VCO thereof, so as to solve the issue of output signal instability of the VCO in the prior art.

The exemplary embodiment of the present invention is implemented in one aspect, providing a phase-locked loop, comprising: a frequency-phase detector used to generate pulse modulation signals of different widths according to a phase difference between two input square wave signals; a charge pump used to output current pulses according to the pulse modulation signals inputted; a loop filter used to perform low-pass filtering on the current pulses and output a voltage control signal; a VCO used to control a frequency of an output signal according to the voltage control signal; a divider used to divide the frequency of the output signal, and input the divided signal to the frequency-phase detector; and a calibration circuit used to acquire the frequency of the output signal from the VCO, calibrate the frequency according to an expected frequency, acquire frequency control parameters of the VCO at a current signal frequency, acquire amplitude control parameters and gain control parameters according to the frequency control parameters, and keep an amplitude and gain of the output signal of the VCO constant according to the amplitude control parameters and the gain control parameters.

In another aspect, the exemplary embodiment of the present invention provides a method for calibrating a VCO in a phase-locked loop, comprising: acquiring a frequency of an output signal of the VCO, and calibrating the frequency of the output signal of the VCO according to an expected frequency; acquiring frequency control parameters of the VCO at a current signal frequency; and acquiring amplitude control parameters and gain control parameters according to the frequency control parameters, and keeping the frequency and a gain of the output signal of the VCO constant according to the frequency control parameters, the amplitude control parameters and the gain control parameters.

The technical schema of the present invention provides the phase-locked loop and the method for calibrating VCO therein. The phase-locked loop comprises the frequency-phase detector, charge pump, loop filter, VCO, divider and calibration circuit. The calibration circuit is used to acquire the frequency of the output signal from the VCO, to calibrate the frequency of the output signal of the VCO according to the desired frequency, and to acquire the frequency control parameters of the VCO at the current signal frequency. The amplitude and gain of the output signal of the VCO are kept constant according to the amplitude control parameters and gain control parameters. The phase-locked loop provided by the present invention has a very wide operating frequency range and superior noise performance, can meet the demands on frequency of multiple protocols and can adaptively look up and stabilize the suitable frequency, so that the circuit has the best performance. At the same time, it solves the issue that the amplitude of the output signal of the VCO is not constant when the phase-locked loop operates in a large frequency range.

DESCRIPTION OF THE DRAWINGS

The exemplary embodiment of the present invention will be understood more fully from the detailed description given below and from the accompanying drawings. Apparently, the accompanying drawings are merely some embodiments of the present invention, and one of ordinary skill in the art may still derive other drawings from these accompanying drawings without creative efforts.

DETAILED DESCRIPTION OF PREFERRED EMBODIMENTS

In order to make the objects, technical schema and advantages of the present invention clearer, the following detailed description is provided for further understanding of the present invention with the accompanying drawings and embodiments. It should be understood that the specific embodiments described herein are merely intended to explain the invention and are not intended to limit the invention.

The following embodiments will illustrate the technical schema of the present invention.

Figure 1:
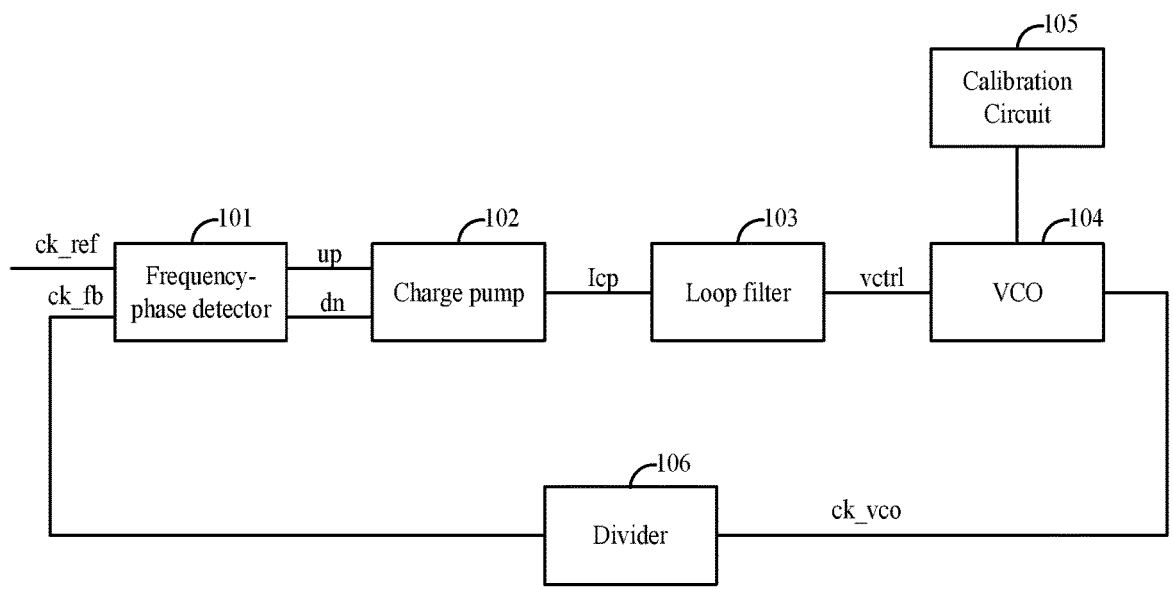
FIG. 1 is a block diagram of a phase-locked loop in accordance with embodiment 1 of the present disclosure.

The exemplary embodiment of the present invention provides a phase-locked loop, as shown in FIG. 1, comprising: a frequency-phase detector 101 used to generate pulse modulation signals of different widths according to a phase difference between two input square wave signals; a charge pump 102 used to output current pulses according to the pulse modulation signal inputted; a loop filter 103 used to perform low-pass filtering on the current pulses and output a voltage control signal; a VCO 104 used to control a frequency of an output signal according to the voltage control signal; a divider 106 used to divide the frequency of the output signal, and input the divided signal to the frequency-phase detector 101; and a calibration circuit 105 used to acquire the frequency of the output signal of the VCO 104, calibrate the frequency according to an expected frequency, acquire frequency control parameters of the VCO 104 at a current signal frequency, acquire amplitude control parameters and gain control parameters according to the frequency control parameters, and keep an amplitude and gain of the output signal of the VCO 104 constant according to the amplitude control parameters and the gain control parameters.

Figure 2:
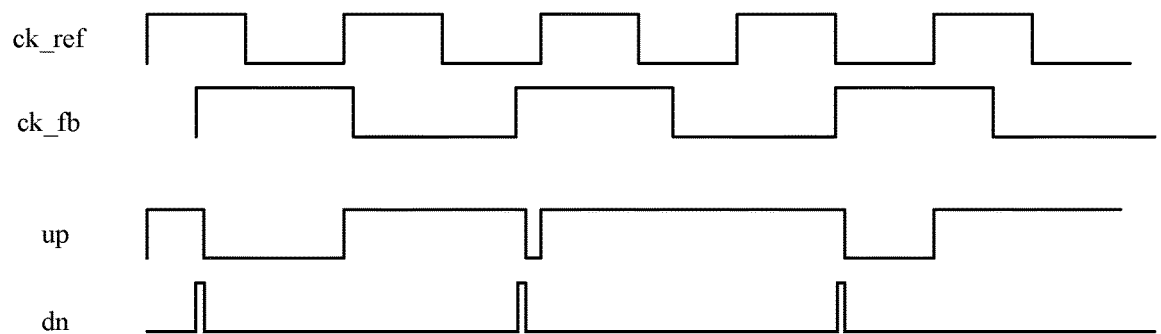
FIG. 2 is a schematic diagram showing that the phase of the reference frequency signal ck_ref in the phase-locked loop is in advance of the phase of the frequency signal ck_fb in accordance with embodiment 1 of the present disclosure.
Figure 3:
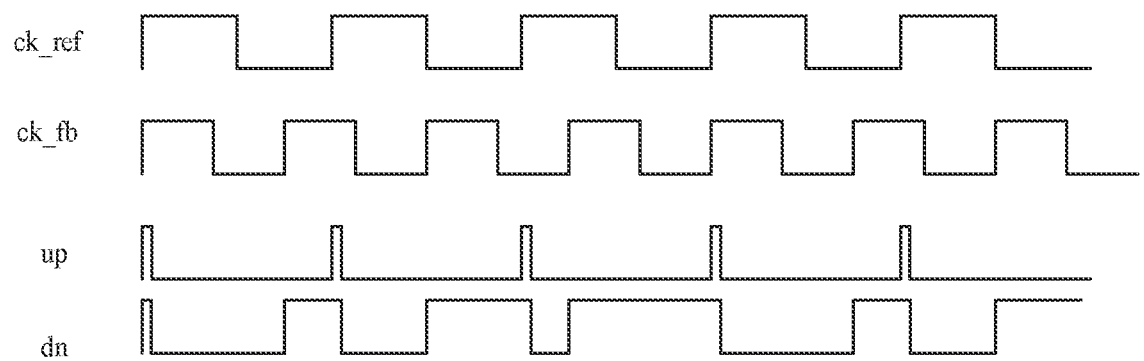
FIG. 3 is a schematic diagram showing that the phase of the reference frequency signal ck_ref in the phase-locked loop is lagged behind the phase of the frequency signal ck_fb in accordance with embodiment 1 of the present disclosure.

For the frequency-phase detector 101, a reference frequency signal ck_ref is input into a first input of the frequency-phase detector 101, and a frequency signal ck_fb output by the divider 106 is input into a second input of the frequency-phase detector 101. The frequency-phase detector 101 generates pulse modulation signals up and dn of different widths according to the phase difference of the two input square wave signals, as shown in FIG. 2. If the phase of the reference frequency signal ck_ref is in advance of the phase of the frequency signal ck_fb, the pulse modulation signal up is output effectively, as shown in FIG. 3. If the phase of ck_ref is lagged behind the phase of ck_fb, the pulse modulation signal dn is output effectively.

Figure 4:
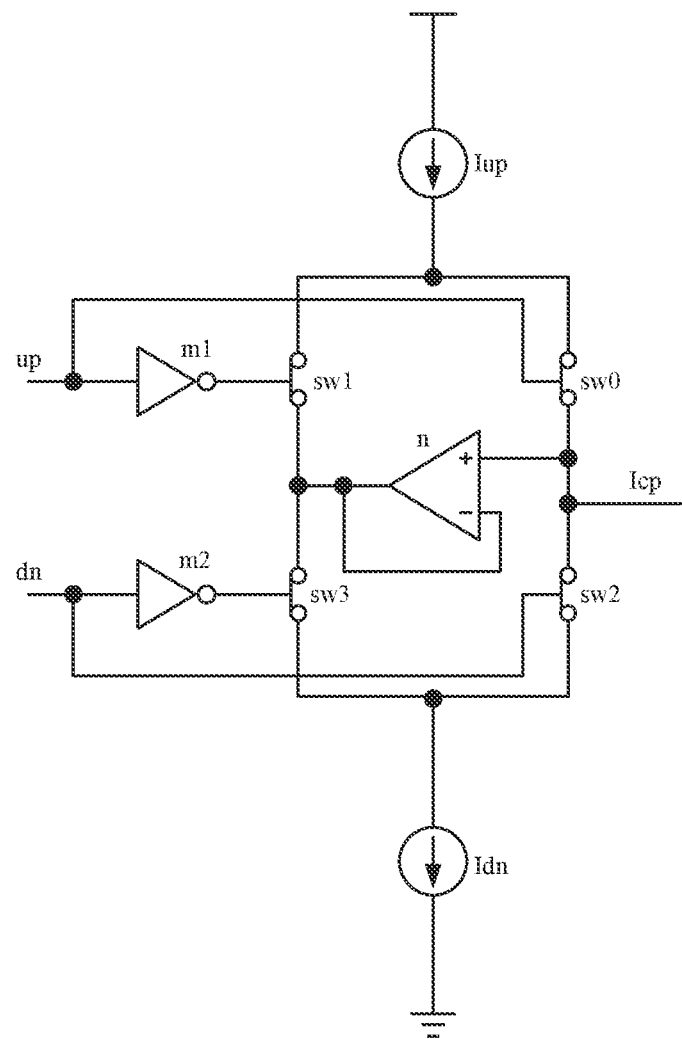
FIG. 4 is a circuit diagram of a charge pump in the phase-locked loop in accordance with embodiment 1 of the present disclosure.

For the charge pump 102, the charge pump 102 outputs a current pulse according to the input pulse modulation signal up or dn. As an embodiment, as shown in FIG. 4, the charge pump 102 comprises an inverter m1, an inverter m2, an operational amplifier n, a controllable switch sw1, a controllable switch sw2, a controllable switch sw3 and a controllable switch sw0. An input of the inverter m1 is connected to the pulse modulation signal up and a control end of the switch sw0. An output of the inverter m1 is connected to a control end of the switch sw1. An input of the inverter m2 is connected to the pulse modulation signal dn and a control of the switch sw2. An output of the inverter m2 is connected to a control end of switch sw3. A first end of the switch sw0 and a first end of the switch sw1 are connected together to a current source Iup. A second end of the switch sw1 is connected to a first end of the switch sw3 and an output of the operational amplifier n. The output of the operational amplifier n is also connected to a negative input of the operational amplifier n. A second end of the switch sw0, a positive input of the operational amplifier n and a first end of the switch sw2 are connected together to form an output of the charge pump 102. A second end of the switch sw2 and a second end of the switch sw3 are connected together to a current source Idn. The charge pump 102 controls charge current inflow and outflow through the pulse modulation signals up and dn. When the pulse modulation signal up is high, the switch sw0 is closed and the switch sw1 is open. The current output from the current source Iup, through the switch sw0, is outflow through a terminal Icp. When the pulse modulation signal dn is high, the switch sw2 is closed and the switch sw3 is open, the current from the current source Idn, through the switch sw2, is inflow through the terminal Icp.

For the loop filter 103, the loop filter 103 is used to perform low-pass filtering on the current pulses and output the voltage control signal.

For the VCO 104, the VCO 104 is used to output a corresponding frequency signal according to the voltage control signal. The VCO 104 produces an oscillating frequency output. A capacitor array is set in the VCO 104, and the frequency of the output signal of the VCO 104 can be adjusted by adjusting the capacitor array.

For the calibration circuit 105, the calibration circuit 105 adaptively adjusts the amplitude, frequency and voltage control gain of the VCO 104 according to a state of the VCO 104. The calibration circuit 105 adjusts the output frequency of the VCO 104 by adjusting the capacitor array, acquires the frequency control parameters at a current signal frequency according to the output frequency, acquires the amplitude control parameters and the gain control parameters according to the frequency control parameters, and adjusts the amplitude and gain of the output signal of the VCO 104 according to the amplitude control parameters and the gain control parameters. The amplitude of the output signal can be adjusted by adjusting the current in the VCO 104, and the gain of the output signal can be adjusted by adjusting the capacitor array of the VCO 104.

For the divider 106, the divider 106 is used to convert frequency of an input voltage signal to the same or lower frequency of an output. The input and output of the divider 106 meet the following relation:

$$F\text{in} = N\text{div} * F\text{out},$$

wherein, Fin is the frequency of the input voltage signal of the divider 106, Fout is the frequency of the output voltage signal of the divider 106, and Ndiv is the divider ratio of the divider 106.

The technical schema of the present invention provides a phase-locked loop. The phase-locked loop comprises the frequency-phase detector, charge pump, loop filter, VCO, divider and calibration circuit. The calibration circuit is used to acquire the frequency of the output signal of the VCO, to calibrate the frequency of the output signal of the VCO according to the desired frequency, and to obtain the frequency control parameters of the VCO at the current signal frequency. The amplitude and gain of the output signal of the VCO are kept constant according to the amplitude control parameters and gain control parameters. The phase-locked loop provided by the present invention has a very wide operating frequency range and superior noise performance, can meet the demands on frequency of multiple protocols and can adaptively look up and stabilize the suitable frequency, so that the circuit has the best performance. At the same time, it solves the issue that the amplitude of the output signal of the VCO is not constant when the phase-locked loop operates in a large frequency range.

Figure 5:
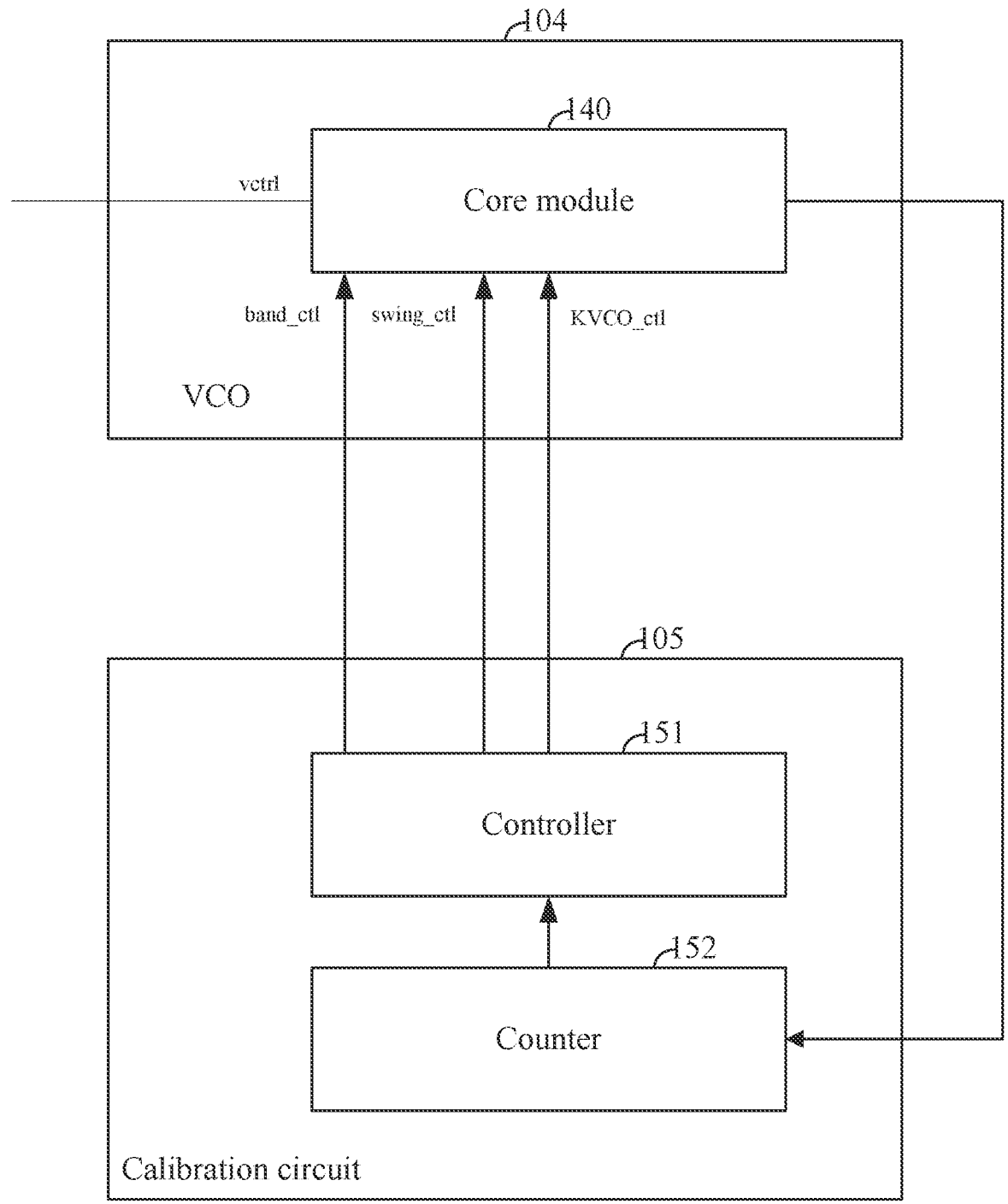
FIG. 5 is a block diagram showing connection between a VCO and a calibration circuit in the phase-locked loop in accordance with embodiment 1 of the present disclosure.

As an embodiment, as shown in FIG. 5, the VCO 104 comprises a core module 140, and the calibration circuit 105 comprises a controller 151 and a counter 152. An input of the counter 152 is connected to an output of the VCO 104, an output of the counter 152 is connected to an input of the controller 151, and an output of the controller 151 is connected to a control end of the core module 140.

The counter 152 compares the frequency of the output signal of the core module 140 with the expected frequency, and sends comparison results to the controller 151.

If the frequency of the output signal from the core module 140 is greater than the expected frequency, the controller 151 adjusts the frequency control parameters output to the core module 140 to decrease the frequency of the output signal from the core module 140 until the frequency of the output signal from the core module 140 is the expected frequency.

If the frequency of the output signal from the core module 140 is less than the expected frequency, the controller 151 adjusts the frequency control parameters output to the core module 140 to increase the frequency of the output signal from the core module 140 until the frequency of the output signal from the core module 140 is the expected frequency.

The counter 152 compares the output frequency with the reference frequency of the VCO 104 to determine whether the output frequency reaches the expected frequency. If the counter 152 counts M cycles of the reference frequency, the expected frequency of the VCO 104 is Ndiv*fck_ref. If the counter 152 counts less than M*Ndiv times in the M cycles of the reference frequency, the oscillation frequency of the VCO 104 is less than the expected frequency, and the frequency control parameters corresponding to higher frequency will be input to the VCO 104. On the contrary, if the counter 152 counts more than M*Ndiv times in M cycles of the reference frequency, the oscillation frequency of the VCO is higher than the expected frequency, and the frequency control parameters corresponding to lower frequency will be input to the VCO 104.

Figure 6:
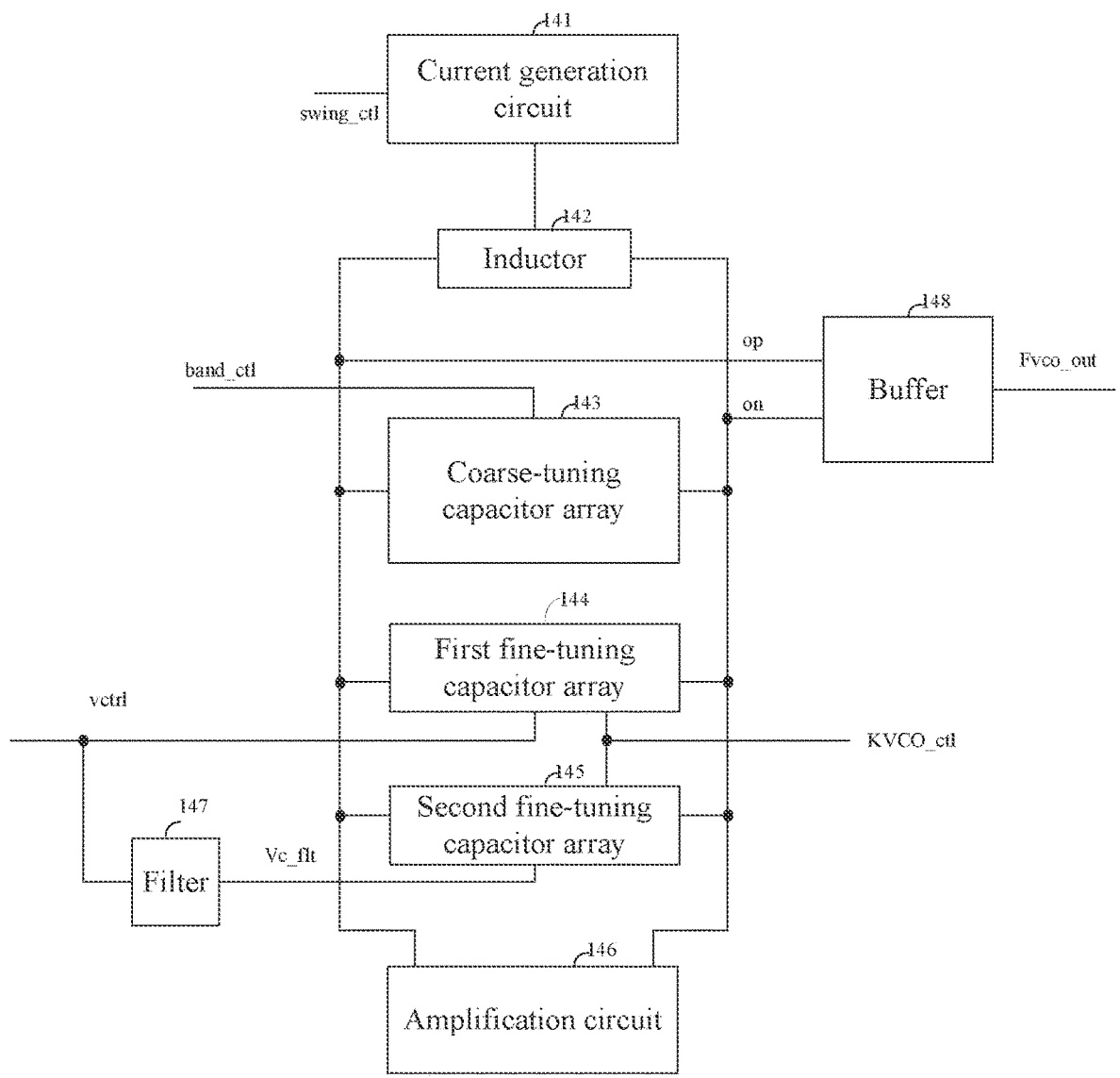
FIG. 6 is a block diagram of a core module in the VCO in the phase-locked loop in accordance with embodiment 1 of the present disclosure.

Further, as shown in FIG. 6, the core module 140 comprises a current generation circuit 141, an inductor 142, a coarse-tuning capacitor array 143, a first fine-tuning capacitor array 144, a second fine-tuning capacitor array 145, a filter 147, a buffer 148, and an amplification circuit 146.

The current generation circuit 141 is connected to the inductor 142. The inductor 142, coarse-tuning capacitor array 143, first fine-tuning capacitor array 144, second fine-tuning capacitor array 145 and amplification circuit 146 are connected in parallel. An input of the filter 147 acts as an input of the VCO 104. The input of the filter 147 is connected to the first fine-tuning capacitor array 144. An output of the filter 147 is connected to the second fine-tuning capacitor array 145. An output of the buffer 148 is connected to the output of the VCO 104, and the controller is connected to the current generation circuit 141, coarse-tuning capacitor array 143, first fine-tuning capacitor array 144 and second fine-tuning capacitor array 145 respectively.

If the frequency of the output signal from the controller 151 in the core module 140 is greater than the expected frequency, the frequency control parameters output to the coarse-tuning capacitor array 143 are adjusted to decrease the frequency of the output signal from the core module 140 until the frequency of the output signal is the expected frequency.

If the frequency of the output signal from the controller 151 in the core module 140 is less than the expected frequency, the frequency control parameters output to the coarse-tuning capacitor array 143 are adjusted to increase the frequency of the output signal from the core module 140 until the frequency of the output signal is the expected frequency.

Further, the controller 151 acquires the amplitude control parameters and the gain control parameters according to the frequency control parameters.

The controller 151 controls the output current of the current generation circuit 141 according to the amplitude control parameters to control the amplitude of the output signal of the VCO 104.

The controller 151 controls the capacitance of the first fine-tuning capacitor array 144 and the second fine-tuning capacitor array 145 according to the gain control parameters to control the gain of the output signal of the VCO 104.

The controller 151 outputs a signal swing_ctl to the current generation circuit 141 in the core module 140 to adjust the current generated by the current generation circuit 141, and to control the oscillation amplitude of voltage oscillation signals op and on output by the core module 140. The current generated by the current generation circuit 141 flows into one end of the inductor 142. The other two ends of the inductor 142 are connected to the voltage oscillation signals op and on respectively. The two ports connected with the voltage oscillation signals op and on serve as input ports of the coarse-tuning capacitor array 143, the first fine-tuning capacitor array 144, the second fine-tuning capacitor array 145, and the amplification circuit 146 respectively.

The controller controls the capacitance of the coarse-tuning capacitor array 143 by outputting a signal band_ctl to the coarse-tuning capacitor array 143. Since the frequency of the output signal from the core module 140 can be expressed as the following formula:

$$f \approx \frac{1}{2\pi\sqrt{L*(Ccoarse + Cfine1 + Cfine2)}}$$

Therefore, the capacitance Ccoarse of the coarse-tuning capacitor array 143 can be changed by adjusting an output signal band_ctl so as to change the frequency. A capacitance of the first fine-tuning capacitor array 144 is Cfine1, and a capacitance of the second fine-tuning capacitor array 145 is Cfine2. The capacitances can be adjusted by changing port voltages of the first fine-tuning capacitor array 144 and the second fine-tuning capacitor array 145. The first fine-tuning capacitor array 144 is directly connected with a voltage vctrl, if the voltage vctrl changes, the capacitance Cfine 1 will be changed rapidly, thereby changing the frequency of the output signal of the core module 140. However, the input of the second fine-tuning capacitor array 145 is connected to the output of the filter 147, and the voltage signal change of the voltage vctrl near the phase-locked loop bandwidth will be filtered by the filter 147. Therefore, the frequency component near the phase-locked loop bandwidth will not be transmitted to the input of the second fine-tuning capacitor array 145, so it will not contribute to effective VCO gain. Therefore, if the sum of the capacitances Cfine1+Cfine2 is a constant, only a proportional relationship between the capacitances Cfine1+Cfine2 is changed, the effective gain of the VCO will be changed, and it can avoid the changing of the frequency of the VCO with the changing of a control signal KVCO_ctl.

The coarse-tuning capacitor array 143 may comprise plurality groups of capacitor modules. Each group of capacitor module comprises a capacitor and a controllable switch. The capacitance of the capacitor array can be adjusted by controlling the switch. The frequency control parameter can be a switch control logic value. For example, different frequency control parameters correspond to different controllable switches, and the frequency control parameter can be increased by turning on a switch corresponding to a smaller capacitance.

The fine-tuning capacitor array is divided into two parts: The first fine-tuning capacitor array 144 and the second time-tuning capacitor array 145. The capacitance ratio of the two parts is K1:K2. The capacitance of the first fine-tuning capacitor array 144 is K1×C0. The capacitance of the second fine-tuning capacitor array 145 is K2×C0, and a sum of K1+K2 is designed as a constant. However, the ratio of K1 to K2 can be changed through the control signal KVCO_ctl.

The voltage control gain of the core module 140 can be expressed as follows:

$$\frac{\Delta f}{\Delta Vctrl} = \frac{K1*\Delta C0}{2*\pi*(L*(Ccoarse + K1*C0 + K2*C0))^{1.5}}$$

wherein, L is the inductance of the inductor 142 and Ccoarse is the capacitance of the coarse-tuning capacitor array 143. With the increase of the frequency, Ccoarse becomes smaller and K1 can be reduced by the control signal KVCO_ctl to make the voltage control gain of the VCO stable in full frequency range. Δf denotes the change in frequency and ΔVctrl denotes the change in the voltage vctrl. K1 denotes the coefficient of the capacitance of the first fine-tuning capacitor array. K2 denotes the coefficient of the capacitance of the second fine-tuning v capacitor array. ΔC0 denotes the unit capacitance change, and C0 is the unit capacitance of the first and second fine-tuning capacitor array. The unit capacitance equals to a ratio of the capacitance to a preset parts. The preset parts are a sum of the coefficients K1 and K2, ensuring that the value of K1+K2 is a constant. However, the ratio of K1 to K2 can be changed through the control signal KVCO_ctl. For example, the preset parts are 10. In a first group, K1=5, K2=5, and the sum of the coefficients K1 and K2 is kept the same if the ratio of K1 to K2 is changed. In a second group, K1=4, K2=6, and the sum of K1 and K2 is unchanged if the ratio of K1 to K2 is changed. The first fine-tuning capacitor array and the second fine-tuning capacitor each may comprise plurality groups of capacitor modules. Each capacitor module comprises a capacitor module and a controllable switch. The capacitance of the capacitor array can be adjusted by controlling the controllable switch. For example, the first fine-tuning capacitor array can be divided into 10 capacitors and 10 controllable switches. The second fine-tuning capacitor array can also be divided into 10 capacitors and 10 controllable switches. Each capacitor can be considered as a unit capacitor. The capacitor connected to the array can be adjusted by controlling the controllable switch. The number of the capacitors connected to the array can be regarded as the coefficient, and the sum of the coefficient K1 and the coefficient K2 remains the same when the ratio of K1 to K2 is changed.

The amplification circuit 146 is used to compensate the energy consumption generated by the real impedance of the capacitor resonant cavity of the loss inductor 142.

The buffer 148 converts the oscillation differential voltage signal generated at both ends of the capacitor resonant cavity of the inductor 142 to a clock voltage signal.

As another embodiment, the VCO 104 comprises a plurality of core modules 140 and the calibration circuit 105 comprises the controller 151 and the counter 152. The input of the counter 152 is connected to the output of the VCO 104. The output of the counter 152 is connected to the input of the controller 151. The output of the controller 151 is connected to the control end of each core module 140.

The counter 152 acquires the frequency of the signal output by the first core module 140 in the VCO 104, and compares the signal frequency with the expected frequency.

If the frequency of the output signal is different to the expected frequency, the controller 151 adjusts the frequency control parameters output to the first core module 140 to adjust the frequency of the signal from the first core module 140.

If all frequencies of the output signals from the first core module 140 are different to the expected frequency, the controller 151 scans the frequencies of the output signals from the remaining core module 140 until the frequency is the expected frequency.

Further, the VCO 104 comprises a plurality of core modules 140. The core modules 140 comprises the current generation circuit 141, the inductor 142, the coarse-tuning capacitor array 143, the first fine-tuning capacitor array 144, the second fine-tuning capacitor array 145, the filter 147, the buffer 148, and the amplification circuit 146.

The current generation circuit 141 is connected with the inductor 142. The inductor 142, the coarse-tuning capacitor array 143, the first fine-tuning capacitor array 144, the second fine-tuning capacitor array 145 and the amplification circuit 146 are connected in parallel. The input of the filter 147 acts as the input of the VCO 104. The output of the titter 147 is connected with the first fine-tuning capacitor array 144 and the second time-tuning capacitor array 145. The output of the buffer 148 is connected with the output of the VCO 104, and the controller is connected with the control ends of the current generation circuit 141, the coarse-tuning capacitor array 143, the first fine-tuning capacitor array 144 and the second fine-tuning capacitor array 145 in each core module 140.

The counter 152 acquires the frequency of the signal output by the first core module 140 in the VCO 104, and compares the signal frequency with the expected frequency.

If the frequency of the output signal is different to the expected frequency, the controller 151 adjusts the frequency control parameters output to the coarse-tuning capacitor array 143 in the first core module 140 to adjust the frequency of the signal output from the first core module 140.

If all frequencies of the output signals of the first core module 140 are different to the expected frequency, the controller 151 scans the frequencies of the output signals of the remaining core module 140 until the frequency is the expected frequency.

Further, the controller 151 acquires the amplitude control parameters and the gain control parameters according to the frequency control parameter.

The controller 151 controls the output current of the current generation circuit 141 according to the amplitude control parameters to control the amplitude of the output signal of the VCO 104.

The controller 151 controls the capacitances of the first fine-tuning capacitor array 144 and the second fine-tuning capacitor array 145 to control the gain of the output signal of the VCO 104 according to the gain control parameters.

The amplitude of the output signal is related to two factors: ($_1$) the current flowing into the inductor-capacitor resonant cavity, that is, the current generated by the current generation circuit 141; (2) the equivalent impedance of inductor-capacitor resonant cavity. The amplitude of the output signal can be expressed in the following formula:

$$Vout = \frac{4}{\pi} * Iss * Rp,$$

wherein Iss is the current generated by the current generation circuit 141 and Rp is the equivalent impedance of the inductor-capacitor resonant cavity. Rp can be expressed as:

$$Rp = \frac{4 * \pi^2 f^2 L^2}{(R_L + R_C)},$$

wherein f is the oscillation frequency of the VCO and L is the inductance of the inductor-capacitor resonant cavity. $R_L$ is the equivalent internal resistance of the inductor in inductor-capacitor resonant cavity and $R_C$ is the equivalent internal resistance of the capacitor in the inductor-capacitor resonant cavity. It can be seen that the amplitude of the output signal is proportional to the square of the oscillation frequency of the VCO. The amplitude of the output signal will increase with the increase of the frequency. Therefore, the amplitude of the output signal may keep relatively constant by adjusting the Iss according to the frequency.

Before the counter 152 determines whether the oscillation frequency of the VCO 104 reaches the expected frequency, it is necessary to wait a certain time to make the output frequency of the VCO 104 stable.

The counter 152 determines whether the oscillation frequency of the VCO 104 reaches the expected frequency in a sequence by scanning the frequencies from small to large or from large to small.

If no expected frequency is found for all oscillation frequencies in one core module of the VCO, the controller 151 of the calibration circuit 105 will enable the other core modules to provide frequencies to the counter. The frequencies can be scanned in a sequence scan mode or a skip search mode.

In order to better reflect the intention of the invention, the two scan modes are described in the specific exemplary embodiment as follows:

The sequence scan mode means scanning the frequency from small to large. The scan starts from the core module 0 and the counter 152 determines whether the expected frequency is reached. If it is less than the expected frequency, a signal band_ctl output to the core module 0 is adjusted to increase the output frequency of the core module 0. If it still finds that the maximum frequency of the core module 0 is less than the expected frequency, the frequency control parameters corresponding to the minimum frequency is sent to the core module 1 whose frequency range is adjacent to that of the core module 0. The frequencies of the core module 1 are also scanned from small to large. If the maximum frequency output by the core module 1 is still less than the expected frequency, similar to the above, the frequencies of the core module 2 are scanned.

The skip search mode means scanning the maximum frequency output from the core module 0. If the maximum frequency is less than the expected frequency, the maximum frequency output from the core module 1 whose frequency range is adjacent to that of the core module 0 is detected. If the maximum frequency output from the core module 1 is greater than the expected frequency, bisearch is performed in the core module 1. Otherwise, the maximum frequency output from the core module 2 is detected, and so on.

If it is expected that the frequency can be adjusted continuously, the center frequencies of adjacent core modules should be overlapped to a certain degree.

If the counter 152 has detected the expected frequency, that is, the signal band_ctl output from the control module is changed between increased and decreased according to the results of counter 152, any one of the two frequency control parameters leading to the change between increase and decrease is selected as the final band_ctl of the core module, and this core module is enabled. The other core modules are hence disabled. According to the frequency control parameter band_ctl from calibration circuit 105 and the enable information of the core module, the corresponding amplitude control parameter swing_ctl and gain control parameter KVCO_ctl are acquired in the lookup table. The amplitude control parameter swing_ctl and gain control parameter KVCO_ctl for the corresponding frequency control parameter band_ctl and the core module can be given by circuit simulation or test.

Figure 7:
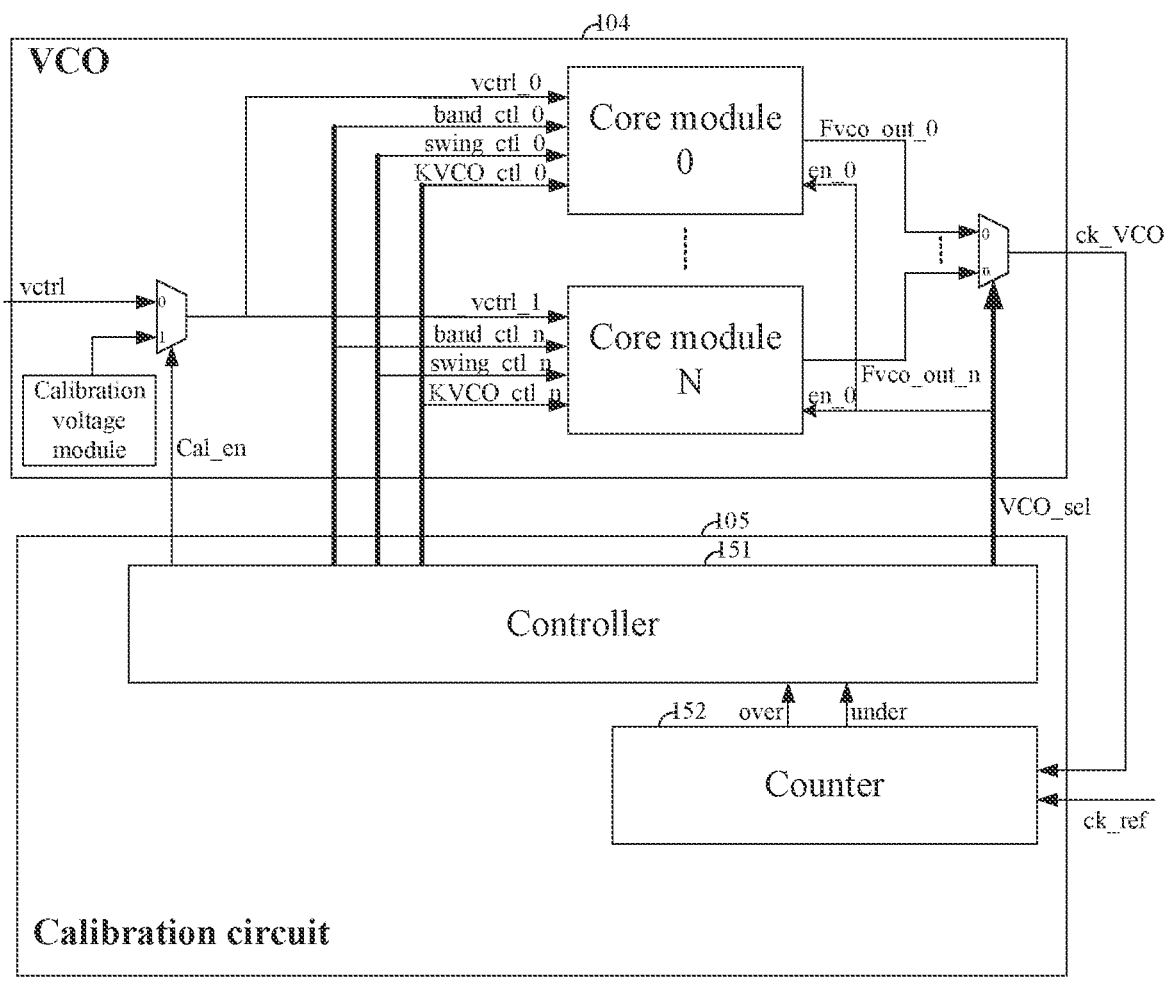
FIG. 7 is a block diagram showing another connection between the VCO and the calibration circuit in the phase-locked loop in accordance with embodiment 1 of the present disclosure.
Figure 8:
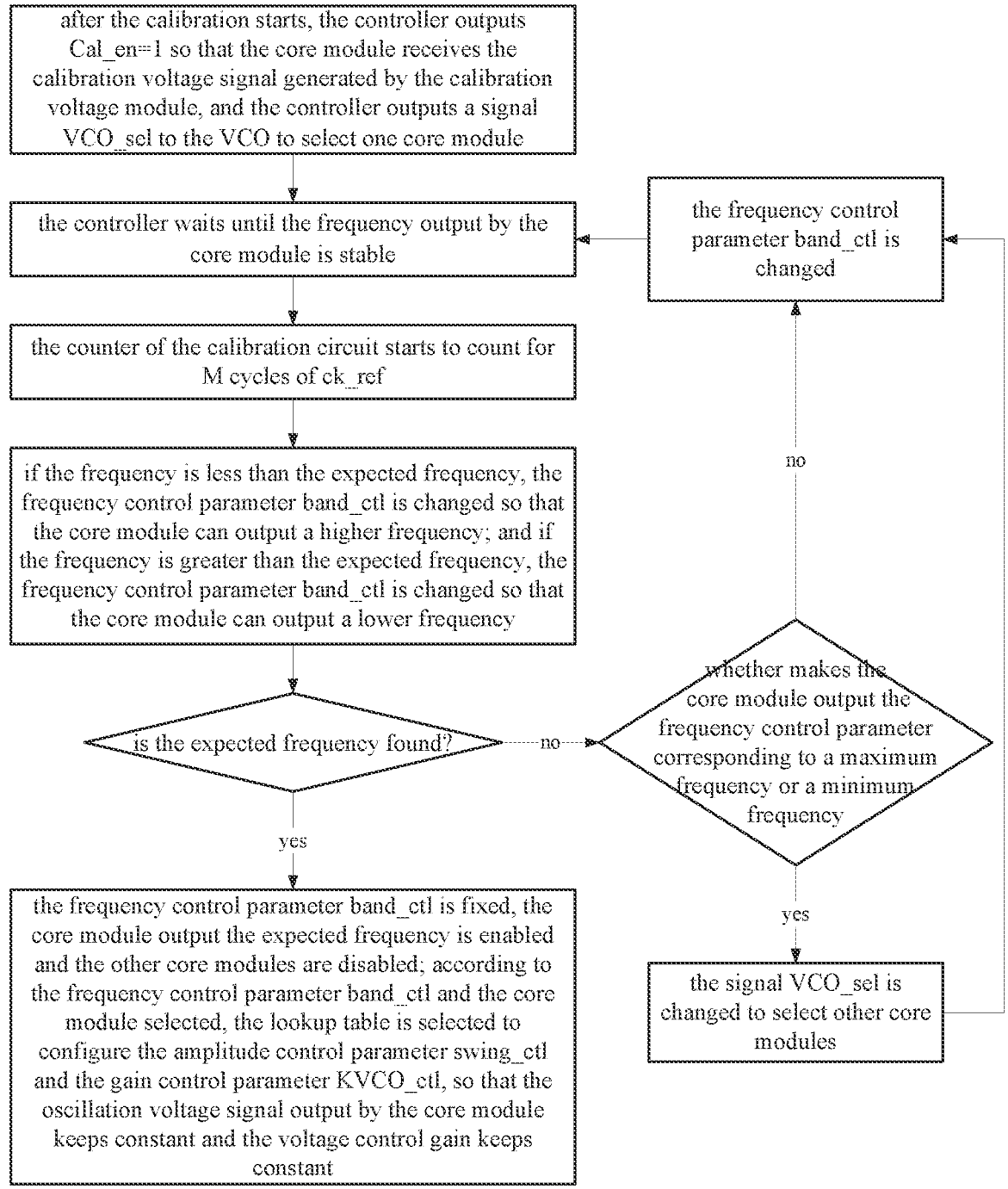
FIG. 8 is a flowchart showing operations of the phase-locked loop in accordance with embodiment 1 of the present disclosure.

The following describes the operating process of this embodiment through FIGS. 7 and 8:

After the calibration starts, the controller outputs Cal_en=1 so that the core module receives the calibration voltage signal generated by the calibration voltage module. The controller outputs a signal VCO_sel to the VCO to select one core module, waits until the frequency output by the core module is stable, and the counter of the calibration circuit starts to count. The counting time is M cycles of ck_ref. The output frequency of the core module is determined. If the frequency is less than the expected frequency, the frequency control parameter band_ctl is changed so that the core module can output a higher frequency. If the frequency is greater than the expected frequency, the frequency control parameter band_ctl is changed so that the core module can output a lower frequency. Then, it is determined whether the expected frequency is found. If the expected frequency is not found, it is determined whether makes the core module output the frequency control parameter corresponding to a maximum frequency or a minimum frequency. If the determining result is no, the frequency control parameter band_ctl is changed and returns to the step of waiting until the frequency output by the core module is stable. If the determining result is yes, the controller outputs the signal VCO_sel to select the other core modules, then the frequency control parameter band_ctl is changed and return to the step of waiting until the frequency output by the core module is stable. The step is repeated until the expected frequency is found, and the frequency control parameter band_ctl is fixed, the core module output the expected frequency is enabled and the other core modules are disabled. According to the frequency control parameter band_ctl and the core module selected, the lookup table is selected to configure the amplitude control parameter swing_ctl and the gain control parameter KVCO_ctl, so that the oscillation voltage signal output by the core module keeps constant and the voltage control gain keeps constant.

Figure 9:
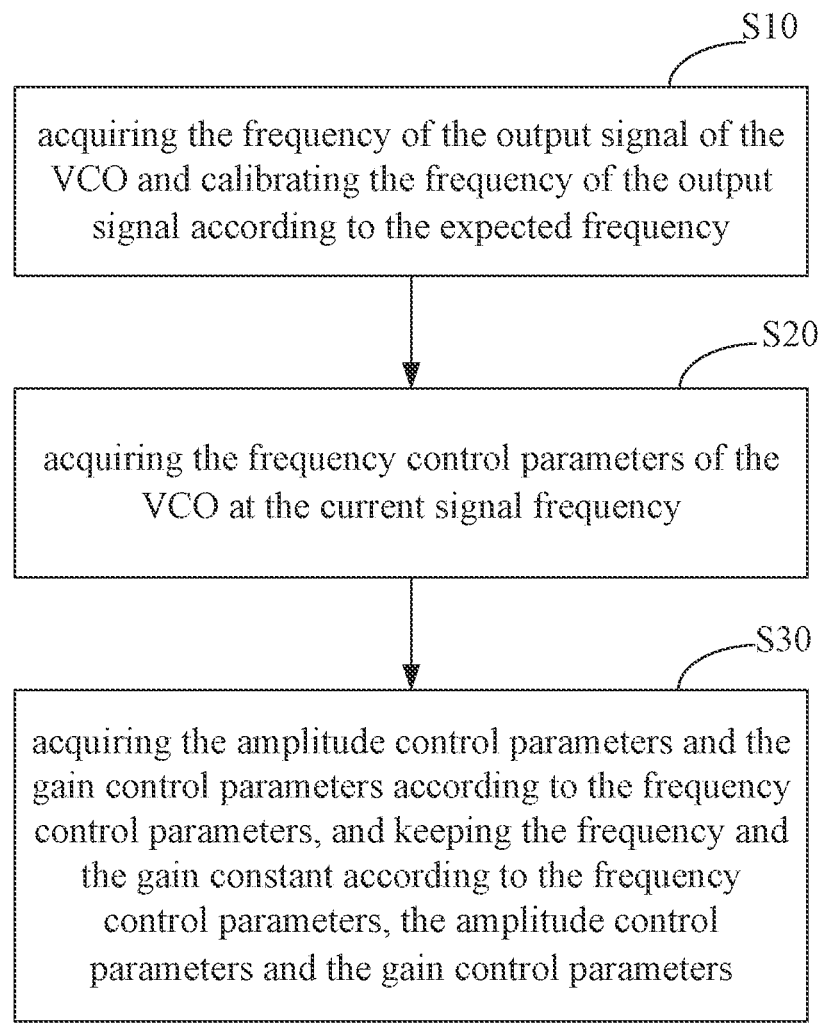
FIG. 9 is a flowchart of a method for calibrating the VCO in the phase-locked loop in accordance with embodiment 2 of the present disclosure.

The second embodiment of the present invention provides a method for calibrating the VOC in the phase-locked loop. As shown in FIG. 9, the method comprises the following steps:

Step S10, acquiring the frequency of the output signal of the VCO, and calibrating the frequency of the output signal of the VCO according to the expected frequency.

Step S20, acquiring the frequency control parameters of the VCO at the current signal frequency.

Step S30, acquiring the amplitude control parameters and the gain control parameters according to the frequency control parameters, and keeping the frequency and the gain constant according to the frequency control parameters, the amplitude control parameters and the gain control parameters.

As an embodiment, the VCO comprises the core module.

Figure 10:
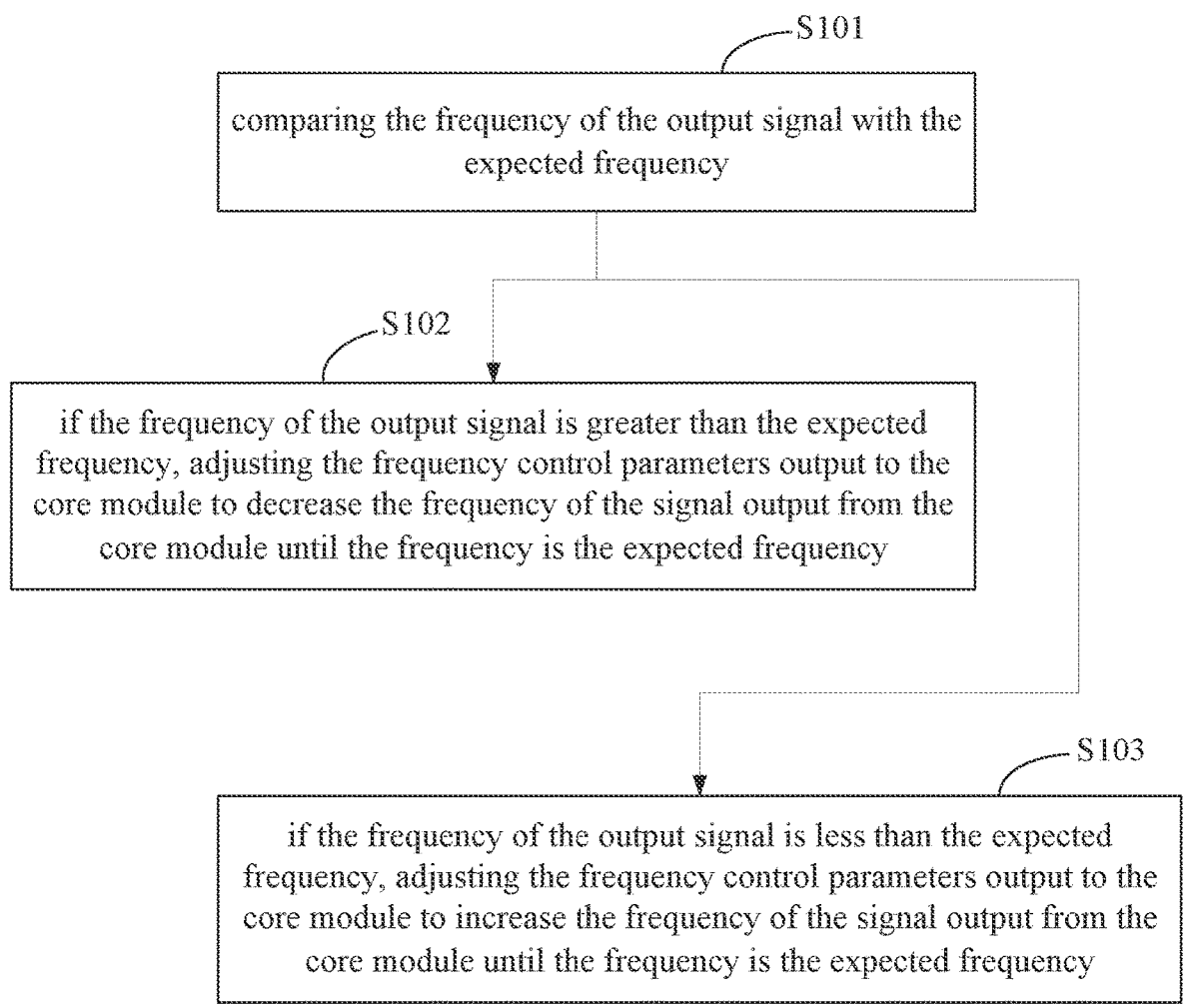
FIG. 10 is a flowchart showing step S10 in the method for calibrating the VCO in the phase-locked loop in accordance with embodiment 2 of the present disclosure.

As shown in FIG. 10, the step of calibrating the frequency of the output signal of the VCO according to the expected frequency in Step S10, comprises:

Step S101, comparing the frequency of the output signal of the VCO with the expected frequency.

Step S102, if the signal frequency of the output signal of the VCO is greater than the expected frequency, adjusting the frequency control parameters output to the core module to decrease the frequency of the signal output from the core module until the frequency is the expected frequency.

Step S103, if the signal frequency is less than the expected frequency, adjusting the frequency control parameters output to the core module to increase the frequency of the signal output from the core module until the frequency is the expected frequency.

As another embodiment, the VCO compares a plurality of core modules.

Figure 11:
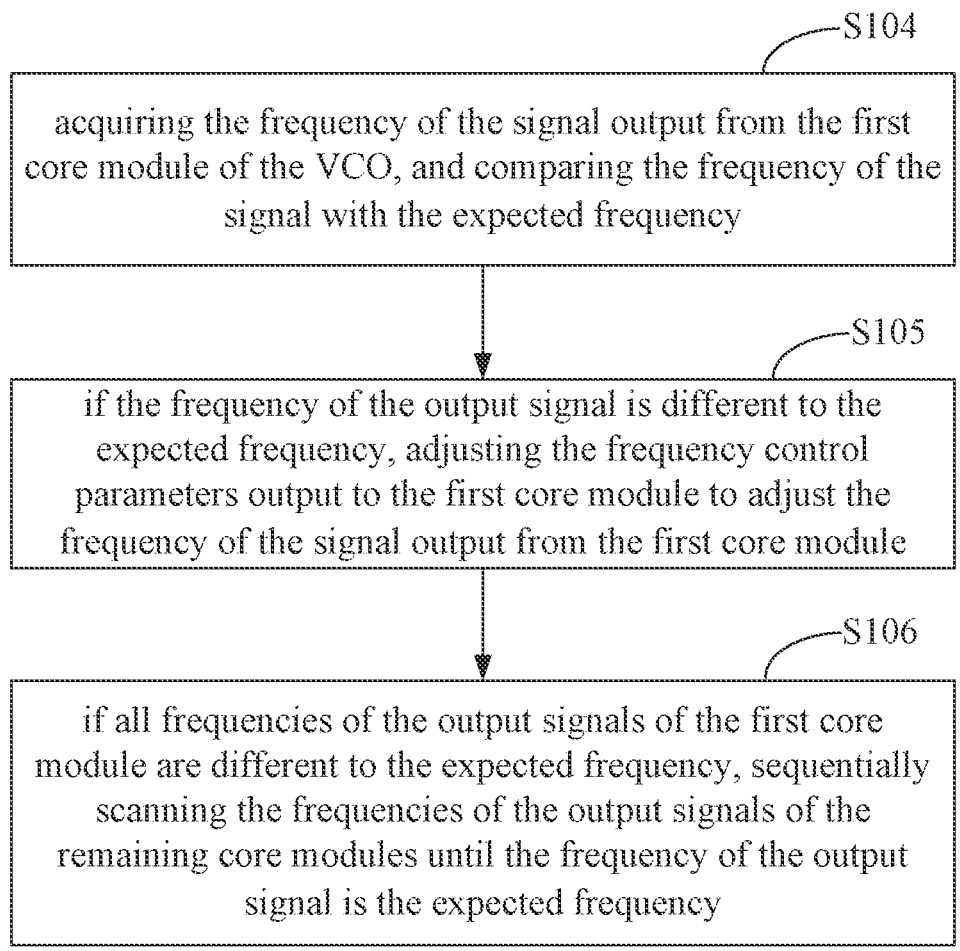
FIG. 11 is another flowchart showing step S10 in the method for calibrating the VCO in the phase-locked loop in accordance with embodiment 2 of the present disclosure.

As shown in FIG. 11, the step S10 of acquiring the frequency of the output signal of the VCO and calibrating the frequency of the output signal of the VCO according to the expected frequency, comprising:

Step S104, acquiring the frequency of the signal output from the first core module of the VCO, and comparing the frequency of the output signal with the expected frequency.

Step S105, if the frequency of the output signal is different to the expected frequency, adjusting the frequency control parameters output to the first core module to adjust the frequency of the signal output from the first core module.

Step S106, if all frequencies of the output signals of the first core module are different to the expected frequency, sequentially scanning the frequencies of the output signals of the remaining core modules until the frequency of the output signal is the expected frequency.

Further, the step of acquiring the frequency control parameters of the VCO at the current signal frequency further comprising:

Enabling the core module whose output frequency is the same with the expected frequency and disabling the remaining core modules.

It should be illustrated that the above embodiments are only used to illustrate the technical schemes of the present invention without limitation, and one of ordinary skill in the art should understand that modifications or equivalent substitutions can be made on the technical schemes of the present invention without departing from the spirit scope of the technical schemes of the present invention, all of which should be contained within the scope of the claims of the present invention.

We claim:

1. A phase-locked loop comprising:
a frequency-phase detector used to generate pulse modulation signals of different widths according to a phase difference between two input square wave signals;
a charge pump used to output current pulses according to the pulse modulation signals inputted;
a loop filter used to perform low-pass filtering on the current pulses and output a voltage control signal;
a voltage controlled oscillator (VCO) used to control a frequency of an output signal according to the voltage control signal;
a divider used to divide the frequency of the output signal, and input the divided signal to the frequency-phase detector; and
a calibration circuit used to acquire the frequency of the output signal from the VCO, calibrate the frequency according to an expected frequency, acquire frequency control parameters of the VCO at a current signal frequency, acquire amplitude control parameters and gain control parameters according to the frequency control parameters, and keep an amplitude and gain of the output signal of the VCO constant according to the amplitude control parameters and the gain control parameters;
wherein the VCO comprises a core module and the calibration circuit comprises a controller and a counter; an input of the counter is connected to an output of the VCO; an output of the counter is connected to an input of the controller; an output of the controller is connected to a control end of the core module;
the core module comprises a current generation circuit, an inductor, a coarse-tuning capacitor array, a first fine-tuning capacitor array, a second fine-tuning capacitor array, a filter, a buffer and an amplification circuit;
the current generation circuit is connected to the inductor; the inductor, the coarse-tuning capacitor array, the first fine-tuning capacitor array, the second fine-tuning capacitor array and the amplification circuit are connected in parallel; an input of the filter acts as an input of the VCO; an iutput of the filter is connected to the first fine-tuning capacitor array and an output of the filter is connected to the second fine-tuning capacitor array; an output of the buffer acts as the output of the VCO; the controller is connected to control ends of the current generation circuit, the coarse-tuning capacitor array, the first fine-tuning capacitor array, and the second fine-tuning capacitor array respectively;
the counter compares the frequency of the output signal of the core module with the expected frequency, and sends comparison results to the controller;
if the frequency of the output signal from the core module is greater than the expected frequency, the controller adjusts the frequency control parameters output to the coarse tuning capacitor array to decrease the frequency of the output signal from the core module until the frequency of the output signal is the expected frequency; and
if the frequency of the output signal from the core module is less than the expected frequency, the controller adjusts the frequency control parameters output to the coarse tuning capacitor array to increase the frequency of the output signal from the core module until the frequency of the output signal is the expected frequency.

2. The phase-locked loop of claim 1, wherein the controller is configured to control an output current of the current generation circuit according to the amplitude control parameters to control the amplitude of the output signal of the VCO; and the controller is further configured to control capacitances of the first fine-tuning capacitor array and the second fine-tuning capacitor array to control the gain of the output signal of the VCO according to the gain control parameters.

3. A phase-locked loop comprising, a frequency-phase detector used to generate pulse modulation signals of different widths according to a phase difference between two input square wave signals;

a charge pump used to output current pulses according to the pulse modulation signals inputted;

a loop filter used to perform low-pass filtering on the current pulses and output a voltage control signal;

a voltage controlled oscillator (VCO) used to control a frequency of an output signal according to the voltage control signal;

a divider used to divide the frequency of the output signal, and input the divided signal to the frequency-phase detector; and a calibration circuit used to acquire the frequency of the output signal from the VCO, calibrate the frequency according to an expected frequency, acquire frequency control parameters of the VCO at a current signal frequency, acquire amplitude control parameters and gain control parameters according to the frequency control parameters, and keep an amplitude and gain of the output signal of the VCO constant according to the amplitude control parameters and the gain control parameters;

wherein the VCO comprises a plurality of core modules and the calibration circuit comprises a controller and a counter; an input of the counter is connected to an output of the VCO; an output of the counter is connected to an input of the controller, and an output of the controller is connected to a control end of each core module;

the core modules each comprises a current generation circuit, an inductor, a coarse-tuning capacitor array, a first fine-tuning capacitor array, a second fine-tuning capacitor array, a filter, a buffer, and an amplification circuit;

the current generation circuit is connected to the inductor; the inductor, the coarse-tuning capacitor array, the first fine-tuning capacitor array, the second fine-tuning capacitor array and the amplifier circuit are connected in parallel; an input of the filter acts as an input of the VCO; an input of the filter is connected to the first fine-tuning capacitor array and an output of the filter is connected to the second fine-tuning capacitor array; an output of the buffer is the output of the VCO, and the controller is connected to control ends of the current generation circuit, the coarse-tuning capacitor array, the first fine-tuning capacitor array and the second fine-tuning capacitor array in each core module;

the counter acquires the frequency of the output signal of a first core module in the VCO, and compares the frequency of the output signal of the first core module with the expected frequency;

if the frequency of the output signal is different to the expected frequency, the controller adjusts the frequency control parameters output to the coarse-tuning capacitor array in the first core module to adjust the frequency of the output signal of the first core module; and if all frequencies of the output signals of the first core module are different to the expected frequency, the controller sequentially scans the frequencies of the output signals of the remaining core modules until the frequency of the output signal is the expected frequency.

* * * * *